(12) United States Patent
Mostafa et al.

(10) Patent No.: US 9,124,310 B2
(45) Date of Patent: *Sep. 1, 2015

(54) RF TRANSMITTER HAVING BROADBAND IMPEDANCE MATCHING FOR MULTI-BAND APPLICATION SUPPORT

(71) Applicant: Broadcom Corporation, Irvine, CA (US)

(72) Inventors: Mohamed A. Mostafa, Santa Clara, CA (US); Derek Shaeffer, Redwood City, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/165,063

(22) Filed: Jan. 27, 2014

(65) Prior Publication Data

US 2014/0141735 A1   May 22, 2014

Related U.S. Application Data

(63) Continuation of application No. 13/336,423, filed on Dec. 23, 2011, now Pat. No. 8,639,286.

(51) Int. Cl.
| | |
|---|---|
| *H03C 1/52* | (2006.01) |
| *H04B 1/00* | (2006.01) |
| *H04B 1/04* | (2006.01) |
| *H04B 1/18* | (2006.01) |
| *H03H 7/38* | (2006.01) |

(52) U.S. Cl.
CPC .............. *H04B 1/005* (2013.01); *H03H 7/38* (2013.01); *H04B 1/0064* (2013.01); *H04B 1/0067* (2013.01); *H04B 1/0458* (2013.01); *H04B 1/18* (2013.01)

(58) Field of Classification Search
CPC ... H04B 1/0458; H04B 1/0067; H04B 1/0053
USPC .......... 455/248.1, 311, 127.3, 144, 552.1, 91, 455/107
See application file for complete search history.

(56) References Cited

U.S. PATENT DOCUMENTS

| | | | | |
|---|---|---|---|---|
| 5,969,582 | A * | 10/1999 | Boesch et al. | 333/129 |
| 6,414,562 | B1 * | 7/2002 | Bouisse et al. | 333/32 |
| 6,628,176 | B1 * | 9/2003 | Okada | 333/32 |
| 6,697,030 | B2 | 2/2004 | Gleener | |
| 6,985,698 | B2 | 1/2006 | Aggarwal et al. | |
| 7,369,834 | B2 * | 5/2008 | Bargroff | 455/302 |
| 7,379,751 | B2 | 5/2008 | Wada et al. | |
| 7,548,734 | B2 | 6/2009 | Lin et al. | |
| 8,639,286 | B2 | 1/2014 | Mostafa et al. | |
| 2006/0151851 | A1 * | 7/2006 | Pillai et al. | 257/531 |
| 2007/0207748 | A1 | 9/2007 | Toncich | |

* cited by examiner

*Primary Examiner* — Sonny Trinh

(74) *Attorney, Agent, or Firm* — Sterne, Kessler, Goldstein & Fox PLLC

(57) ABSTRACT

Systems and methods are provided for a broadband, closed-loop RF transmitter for multi-band applications that employs a single RF path to service multiple bands of operation. Embodiments of the present disclosure implement a broadband impedance matching module, which avoids the need for several costly and complex narrow-band matching networks. In an embodiment, the broadband impedance matching module includes concentric, mutually-coupled inductors. By adding this broadband impedance matching functionality, delay is significantly reduced because a single path can be used to service multiple bands.

20 Claims, 12 Drawing Sheets

RF TRANSMITTER HAVING BROADBAND IMPEDANCE MATCHING FOR MULTI-BAND APPLICATION SUPPORT

CROSS REFERENCE TO RELATED APPLICATIONS

This application is a continuation of U.S. patent application Ser. No. 13/336,423, filed on Dec. 23, 2011, assigned U.S. Pat. No. 8,639,286, which is incorporated herein by reference in its entirety.

FIELD OF THE INVENTION

This invention relates to radio frequency (RF) transmitters and more specifically to multi-band RF transmitters.

BACKGROUND

Many conventional RF transmitters utilize a distinct RF path (i.e., multiple modulators and RF amplifier lineups) for each supported frequency band. These multiple RF paths increase the cost of producing the transmitter for each additional band that is supported. Further, the use of distinct RF paths for each band increases the delay in a closed-loop feedback RF transmitter, which can impair the stability margin of the feedback system.

What is needed are methods and systems for efficiently providing multi-band application support using an RF transmitter.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure.

Figure 1A:
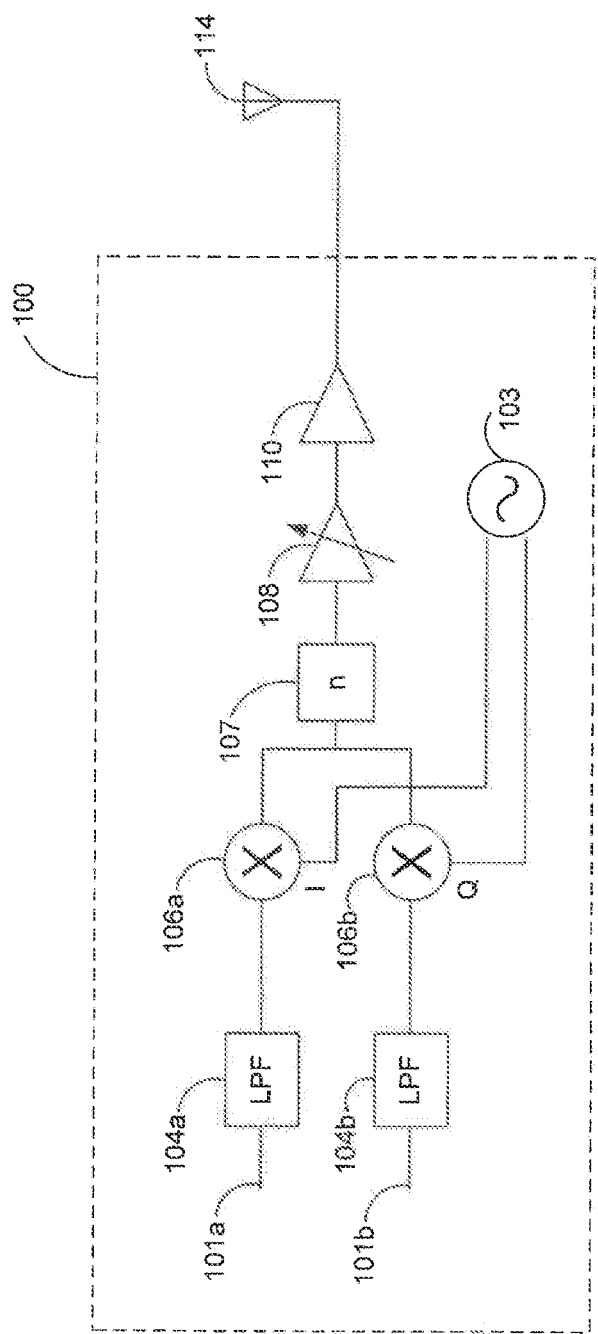
FIG. 1A is a block diagram of a conventional transmitter.

Features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. Overview

Because different frequency bands are used for communication in different parts of the world, support for many different frequency bands is often necessary functionality to include when designing a wireless transmitter. Previous implementations of multi-band RF transmitters utilize a distinct RF path (i.e., multiple modulators and RF amplifier lineups) for each supported frequency band. Each of the multiple RF paths in a conventional multi-band RF transmitter often includes a narrow band impedance matching network that is designed to provide impedance matching between components for the particular narrow band of interest.

Because each added RF path in a conventional transmitter includes multiple elements (e.g., modulators, RF amplifier lineups, and narrow-band impedance matching modules), transmitter cost increases with each additional supported frequency band. Further, the use of distinct RF paths for each supported frequency band increases the delay in a closed-loop feedback RF transmitter, which can impair the stability margin of the feedback system.

Embodiments of the present disclosure provide a broadband, closed-loop RF transmitter for multi-band applications that employs a single RF path to service multiple frequency bands of operation. Thus, embodiments of the present disclosure can be used to provide a transmitter for a mobile device that works worldwide and includes a reduced amount of circuitry. By implementing a broadband impedance matching module, the RF transmitter operates in a wide frequency bandwidth and can use a single modulator and/or demodulator to support multiple frequency bands. Thus, this wide operating frequency bandwidth reduces delay caused by implementation of multiple modulators and demodulators. This reduction in delay enables a feedback loop to be coupled to the transmitter, which improves the linearity of the transmitter. Further, embodiments of the present disclosure include a compact, monolithic implementation comprising concentric, mutually-coupled inductors, which avoids costly and complex matching networks.

Thus, embodiments of the present disclosure avoid the need for multiple RF chains and enable multi-band application support and wide linearization of bandwidth due to a significant reduction in delay associated with the broadbanding circuitry. Further, by enabling the sharing of hardware among multiple bands, embodiments of the present disclosure advantageously reduce the cost, power consumption, and die area required to implement the closed-loop RF transmitter.

2. Systems

2.1 Conventional Multi-Band Transmitters

FIG. 1A is a block diagram of conventional transmitter circuitry 100 coupled to an antenna 114. Transmitter 100 in-phase (I) and quadrature (Q) inputs 101 that are filtered by respective low pass filters (LPF's) 104. Transmitter 100 also includes an I/Q modulator 106 (e.g., a pair of quadrature mixers 106a and 106b) supplied with a reference signal from local oscillator (LO) 103 for performing up-conversion of the input signals 101. The output of I/Q modulator 106 is summed at the input of narrow-band impedance matching network 107, which includes one or more narrow-band inductors. Narrow-band matching network 107 provides an impedance match between the output of I/Q modulator 106 and the rest of the RF path, including the pre-driver 108, power amplifier 110, and antenna 114. The narrow-band impedance matching network 107 maximizes the power transferred by the RF path and minimizes signal reflections.

Because of the hardware limitations of narrow-band matching network 107, impedance matching is performed for a band-limited frequency range (e.g., the operating frequency of the coupled RF path). Because pre-driver 108 and power amplifier 110 are narrow-band elements (i.e., designed to operate for a specific frequency range), the hardware limitations of narrow-band matching network 107 do not substantially impact the cost of producing the circuit when only one frequency band is supported. However, when multiple frequency bands are supported, the design of FIG. 1A becomes inefficient and expensive.

Figure 1B:
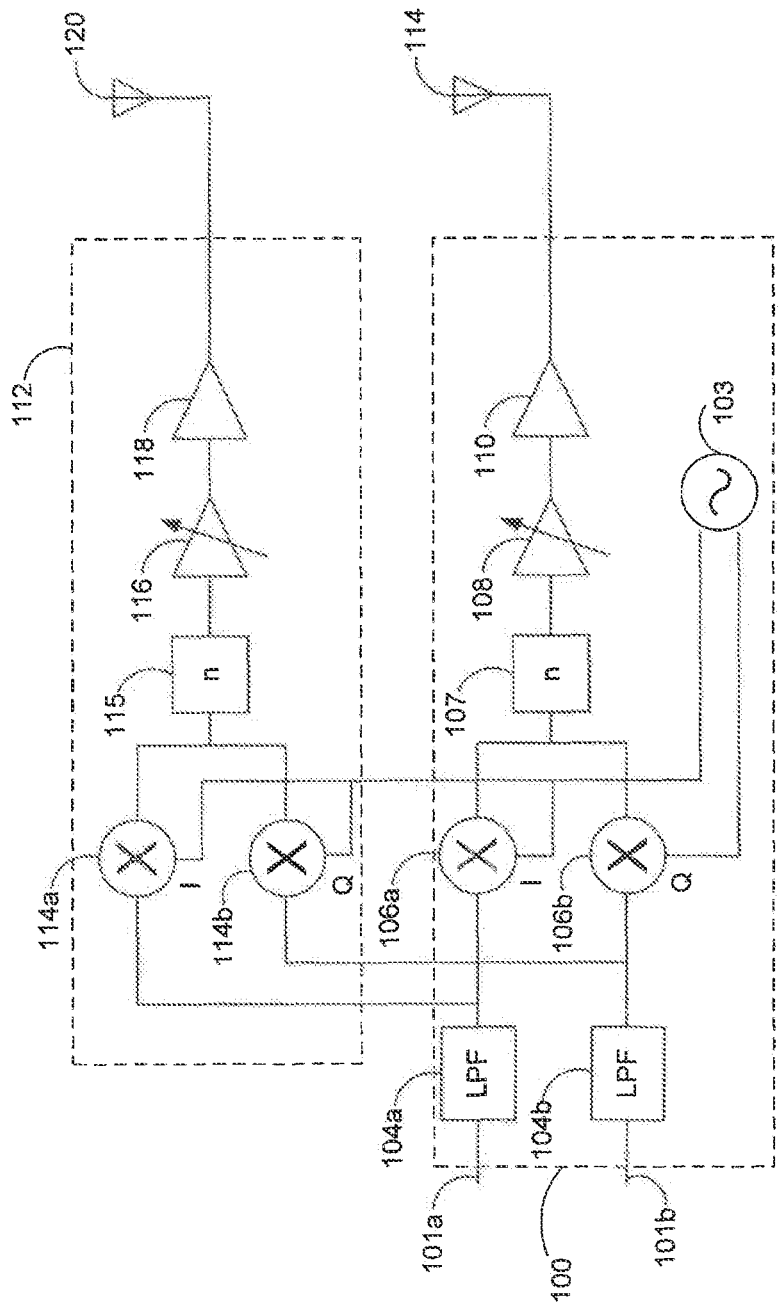
FIG. 1B shows a block diagram of a conventional multi-band transmitter.

FIG. 1B is a block diagram of a conventional multi-band transmitter. As previously discussed, pre-driver 108 and power amplifier 110 are narrow-band elements that are designed to send a signal within a pre-defined frequency band to antenna 114 for transmission. In FIG. 1B, additional transmitter components 112 are included to process a signal within a second frequency band and forward this signal to antenna 120 for transmission. These additional transmitter components 112 include an additional I/Q modulator 114, additional narrow-band matching network 115, additional pre-driver 116, and additional power amplifier 118. If a third frequency range is to be supported using this transmitter design, a third set of transmitter components will be required.

These multiple RF paths increase the cost of producing the transmitter for each additional frequency band that is supported. The RF paths in FIG. 1B cannot be designed to share a single narrow-band matching network because each coupled RF path operates in a different frequency range. Further, the RF paths in FIG. 1B cannot be designed to share a single I/Q modulator because I/Q modulators 114 and 106 are couple to narrow-band matching networks 115 and 107, respectively.

Embodiments of the present disclosure provide a broadband, closed-loop RF transmitter for multi-band applications that employs a single RF path to service multiple bands of operation without adding significant delay. By using a single broadband matching module to support multiple RF paths, embodiments of the present disclosure can provide a multi-band transmitter that requires less circuitry than the multi-band transmitter of FIG. 1B. For example, by broadbanding the matching network, embodiments of the present disclosure provide a transmitter that shares a single matching network and I/Q modulator for each coupled RF path.

2.2 Transmitter with Feedback Loop and Narrow Band Matching Network

The transmitter design of FIGS. 1A and 1B also has additional disadvantages. For example, the use of distinct RF paths for each band increases the delay in a closed-loop feedback RF transmitter, which can impair the stability margin of the feedback system. The additional delay caused by the circuitry of FIG. 1B (e.g., introduced by requiring multiple modulators 114 and 106) makes adding a feedback loop impractical because feedback loops require a small delay to operate effectively.

Figure 2:
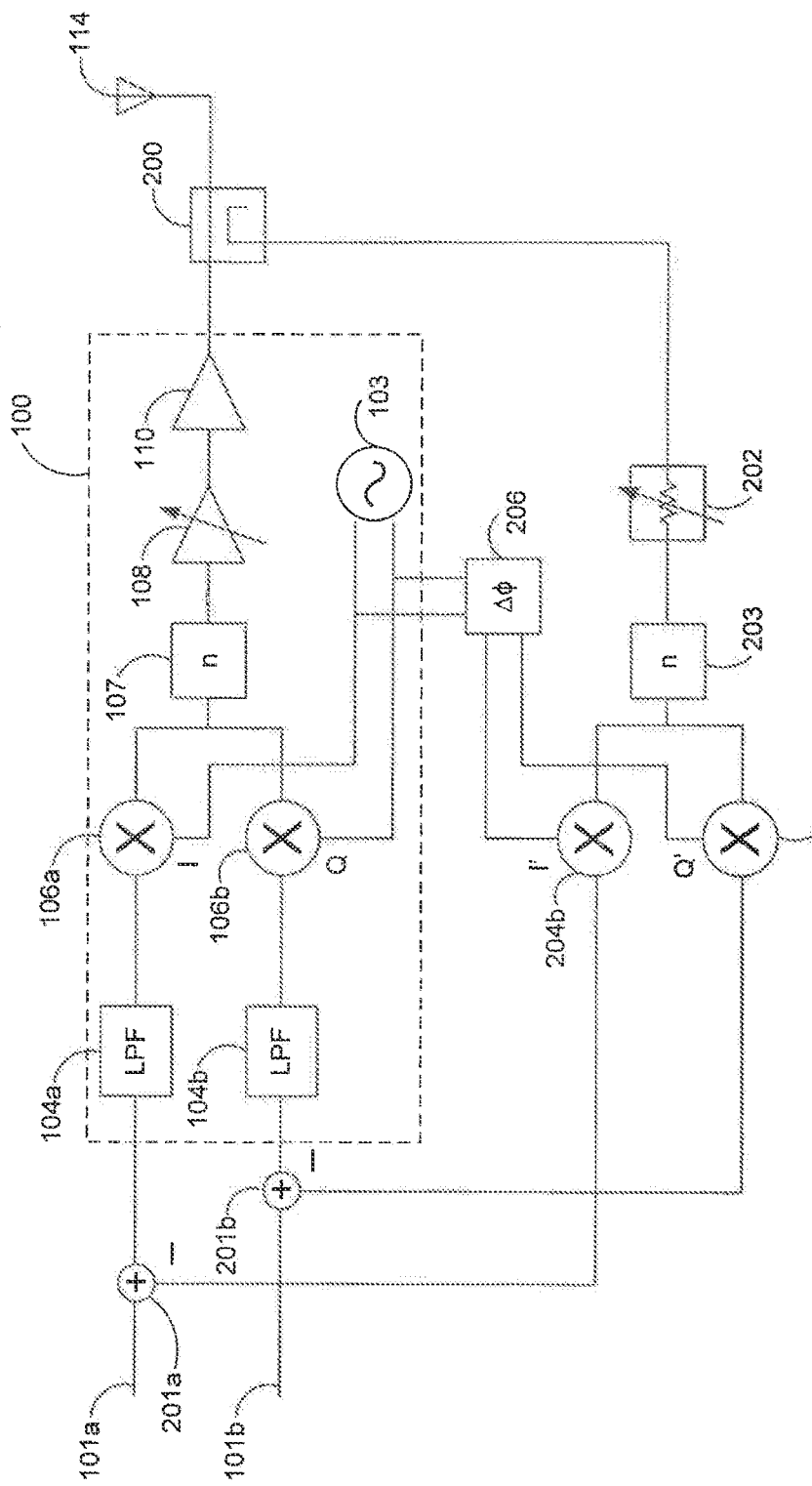
FIG. 2 is a block diagram of a transmitter integrated with a Cartesian feedback loop.

FIG. 2 is a block diagram of a transmitter 100 integrated with a Cartesian feedback loop. FIG. 2 shows a transmitter with a single antenna 114 that transmits information within a single frequency band. Embodiments of the present disclosure with multiple frequency bands are discussed below (e.g., with reference to FIG. 3). In FIG. 2, transmitter 100 obtains inputs from two summing nodes 201 used to input information fed back to transmitter 100 from the feedback loop. The feedback loop formed by feeding the outputs of I/Q demodulator 204 back into transmitter 100 via summing nodes 201 enables transmitter 100 to operate in a very linear fashion (e.g., having a linear output signal amplitude). This increased linearity improves the performance of transmitter 100. For example, by improving linearity in power sent to transmitter 114, more power can be sent to transmitter 114 without requiring additional power consumption by the circuit of FIG. 2. Thus, even though additional components are added to transmitter 100 in FIG. 2, the power consumption of the circuit of FIG. 2 can be lower than the power consumption of the circuit of FIG. 1A because power linearity is improved.

Coupler 200 is used to obtain a signal representative of the signal sent to antenna 114 and to forward this signal to a feedback loop for processing. For example, the feedback loop includes sensing receiver 202, narrow band matching network 203, IQ modulator 204, and phase shifter 206, all of which are described below. In an embodiment, coupler 200 obtains a signal with a predetermined (e.g., predetermined based on the hardware characteristics of coupler 200) fraction of the power that is transmitted to antenna 114 and forwards this signal to the feedback loop. Obtaining a signal with lower power reduces the power required for operating elements within the feedback loop. The output of the feedback loop can then be fed back into transmitter 100 (via summing nodes 201), which is designed to receive lower power inputs and to transmit a higher power amplified output to antenna 114.

The output of coupler 200 is fed to sensing receiver 202, which measures the output power from the coupler. Since the coupler's output power can be a predetermined (e.g., predetermined based on the hardware characteristics of coupler 200) fraction of the power of the signal sent to antenna 114, sensing receiver 202 can determine the power of the signal transmitted to antenna 114 based on the sensed power of the signal received from coupler 200.

Sensing receiver 202 passes the signal to another narrow band matching network 203, which includes a narrow-band inductor. Because of the hardware limitations of the narrow-band inductor in narrow-band matching network 203, only frequencies within the range supported by narrow-band matching network 203 are supported. If signals from other frequency bands were received by sensing receiver 202, another narrow band matching network would be required to support narrow-band impedance matching for these received signals.

The output of narrow band matching network 203 is demodulated using I/Q demodulator 204. Phase adjustment module 206 adjusts the phase of the LO signal sent from LO 103 so that the same LO 103 can be used for I/Q modulator 106 and I/Q demodulator 204. In other words, phase adjustment module 206 adjusts the delay of the signal sent to I/Q demodulator 204 so that its phase matches the phase of the signal sent to I/Q modulator 106. The output of I/Q demodulator 204 is fed back into transmitter 100 via the summing nodes 201.

While the embodiment of FIG. 2 includes a single I/Q modulator 106, additional I/Q modulators would be required if the embodiment of FIG. 2 (using narrow-band impedance matching) were expanded to include support for another frequency range. For example, as shown in FIG. 1B, two I/Q modulators (modulators 114 and 106) are needed for multi-band application support if narrow-band impedance matching is used. If the feedback loop of FIG. 2 were added to the multi-band transmitter of FIG. 1B (incorporating narrow-band impedance matching), an additional I/Q demodulator would also be required in the feedback path.

Adding an extra I/Q modulator/demodulator pair for each supported frequency band not only adds to circuit complexity but also introduces unwanted delay into the circuit. This delay prevents the feedback loop from operating effectively. Because embodiments of the present disclosure avoid the need for the addition of extra I/O modulator/demodulator pairs for every supported frequency band, embodiments of the present disclosure avoid unwanted delay and enable the use of an effective Cartesian feedback loop, which enables the transmitter to operate in a linear fashion and improves performance of the transmitter.

2.3 Multi-Band Transmitter with Feedback Loop and Broadband Matching

Figure 3A:
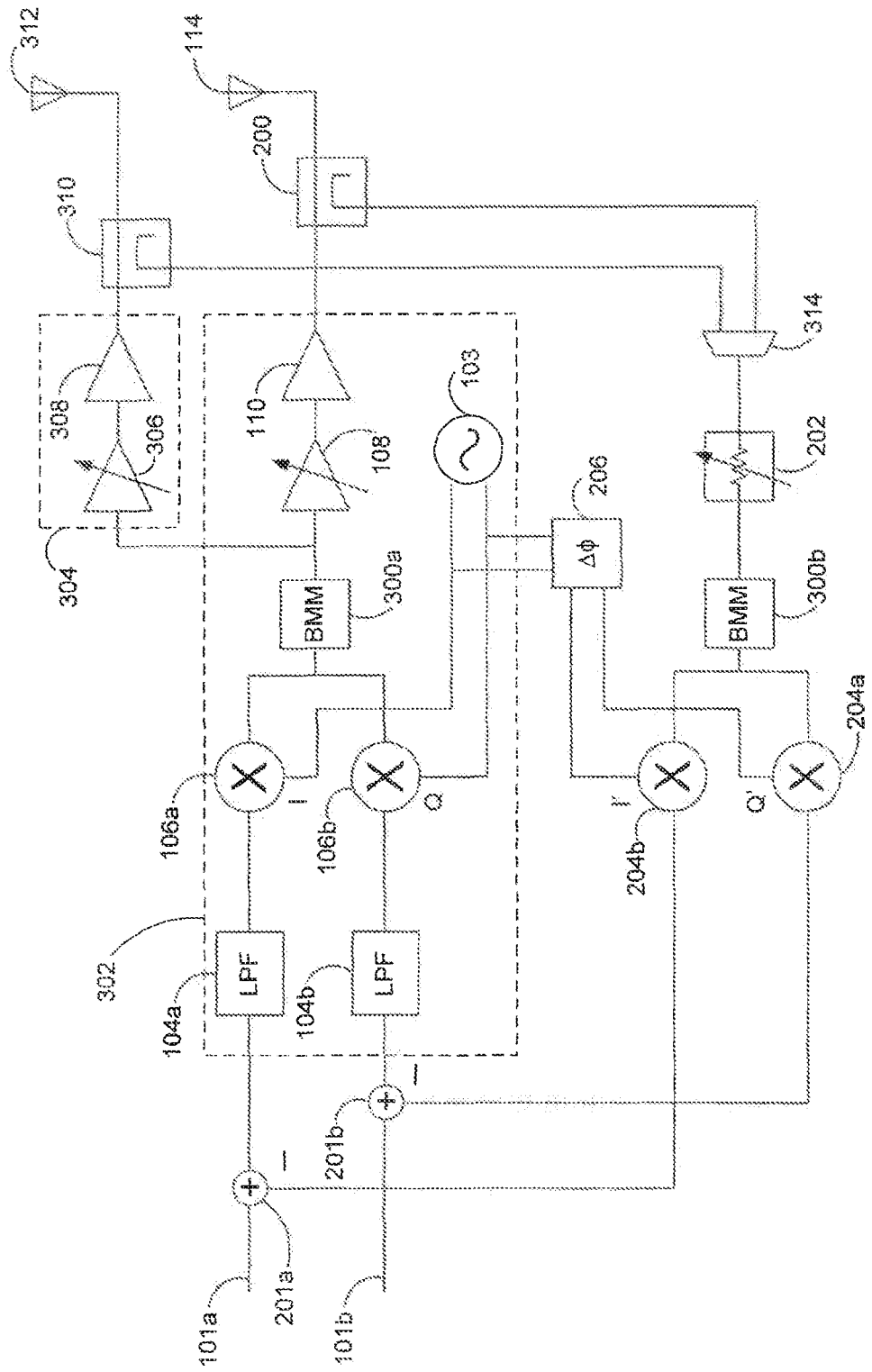
FIG. 3A shows a block diagram of a multi-band transmitter with a feedback loop in accordance with embodiments of the present disclosure.

FIG. 3A shows a block diagram of a multi-band transmitter with a feedback loop in accordance with embodiments of the present disclosure. In FIG. 3A, broadband matching module 300a is added to a transmitter 302. In an embodiment, broadband matching module 300a acts as a wide-band transformer that interfaces between one set of quadrature mixers (e.g., I/Q modulator 106) and any number of pre-amplifiers and power amplifiers. For example, conventional transmitters and their corresponding narrow band impedance matching networks can operate in a 200-300 MHz band. Broadband matching module 300a can operate in a wide frequency range (e.g., in an embodiment, 2-4 GHz). This very wide band frequency range for matching enables broadband matching module 300a to support a wide range of multiple RF paths. For example, in an embodiment broadband matching module 300a can be configured to support a 2-4 GHz range so that a plurality of frequency bands can operate inside the 2-4 GHz range. Other frequency ranges could be utilized as will be understood by those skilled in the arts.

Embodiments of the present disclosure including broadband matching module 300a enable additional RF paths to be coupled to a single broadband matching module. Broadband matching module 300a enables these additional RF paths to utilize fewer components with respect to those required by conventional RF transmitters. For example, the additional RF path added to the conventional transmitter of FIG. 1B requires additional I/Q modulator 114 and additional narrow-band matching network 115. In the embodiment of the present disclosure illustrated by FIG. 3, the addition of broadband matching module 300a avoids the need for this additional modulator 114 and additional narrow-band matching network 115. Rather, in FIG. 3A, the additional components 304 added to support this additional RF path include additional pre-driver 306 and additional power amplifier 308. Because I/Q modulator 106 is coupled to a broadband matching module 300a, modulator 106 can perform modulation over a broad range of frequencies, including the operating frequency ranges used by power amplifiers 308 and 110. Thus, in the embodiment of FIG. 3A, separate modulators are not required for each supported frequency band because, when broadband impedance matching is used, modulation for a broad range of frequencies can be performed by a single modulator without losing information when the signal is passed to the broadband matching module.

In FIG. 3A, power amplifier 308 outputs a signal to antenna 312, which is configured for operation in a different frequency band than the frequency band used by antenna 114. Coupler 310 and coupler 200 obtain signals representative of the signals sent to antennas 312 and 114, respectively, and transmit these signals to multiplexer 314. Multiplexer 314 multiplexes these signals and sends them to sensing receiver 202, which senses the power of the multiplexed signal.

Since the output power of couplers 310 and 200 can be a predetermined (e.g., predetermined based on the hardware characteristics of couplers 310 and 200) fraction of the power of the signal sent to antennas 114 and 312, sensing receiver 202 can determine the power of the signals transmitted to antennas 114 and 312 based on the sensed power of the multiplexed signal.

Elements 314, 202, 300b, and 204 of FIG. 3A act as a multi-band receiver. Sensing receiver 202 transmits the signal to another broadband matching module 300b, which interfaces to demodulator 204. In an embodiment, broadband matching module 300b can be identical to broadband matching module 300a. The configuration of the elements of broadband matching modules 300a and 300b is explained in greater detail below with reference to FIG. 4A.

The use of broadband matching module 300b in the feedback path also reduces the circuitry needed to add functionality to support additional bands. For example, demodulation for multiple frequency bands can be done using one I/Q demodulator 204 if broadband matching module 300b is included in the circuit. Because broadband matching module 300b can perform impedance matching for a wide range (e.g., in an embodiment, a 2-4 GHz range) of signals received by sensing receiver 202, broadband matching module 300b avoids the need to include multiple narrow-band matching networks for receiving signals within different frequency ranges.

Thus, by employing broadband matching, (N−1) transmit-side narrow-band matching networks, (N−1) I/Q modulators, (N−1) I/Q demodulators, and (N−1) receive-side narrow-band matching networks are eliminated, where N is the number of bands served. Further, by avoiding the need to include these additional I/Q modulators 114 and additional narrow-band matching networks 115, delay within the circuit is reduced, which enables the linearization provided by the Cartesian feedback loop.

Figure 3B:
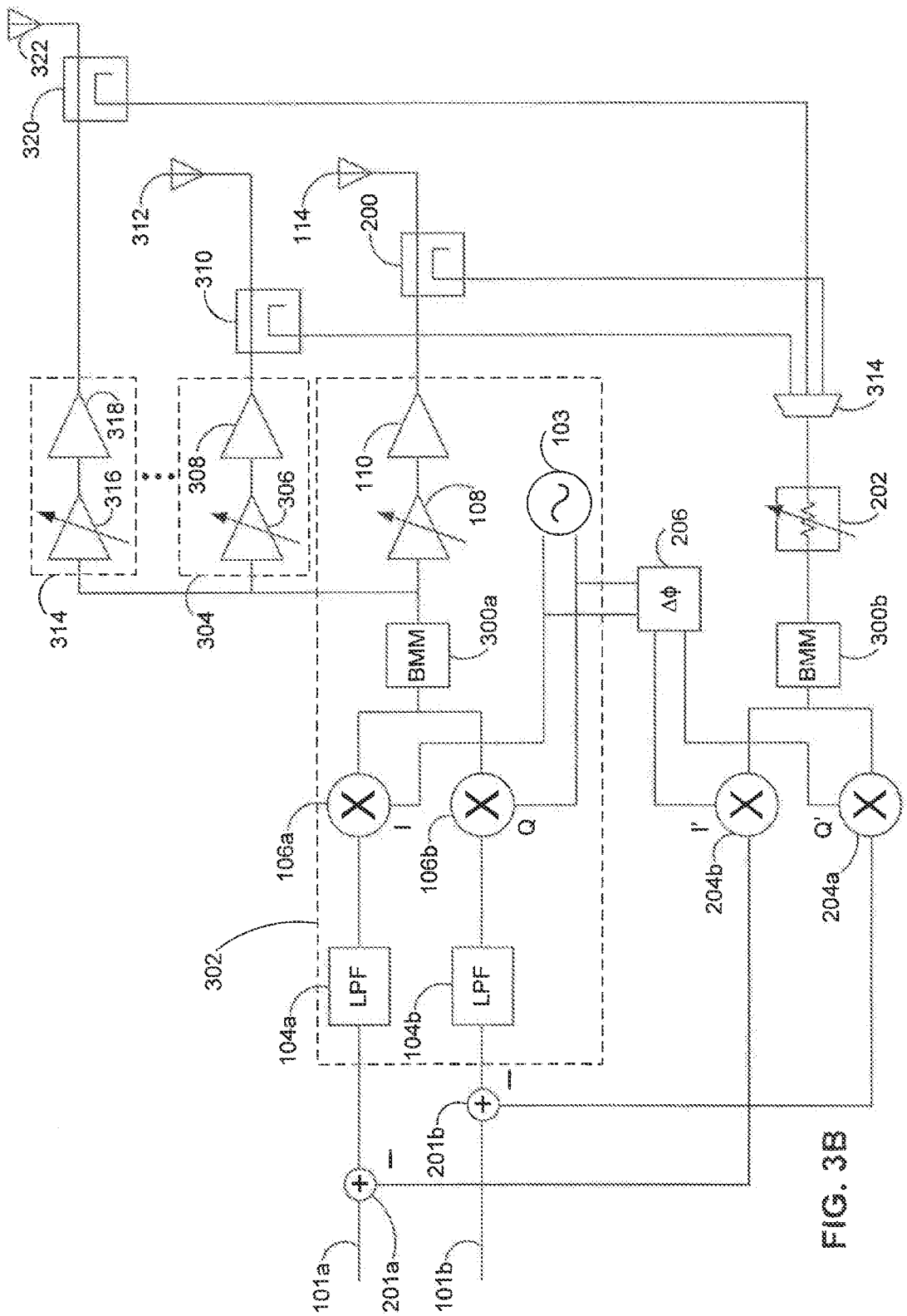
FIG. 3B shows block diagram of an embodiment of the present disclosure incorporating additional RF paths into the multi-band transmitter of FIG. 3A.

FIG. 3B shows block diagram of an embodiment of the present disclosure incorporating additional RF paths into the multi-band transmitter of FIG. 3A. Broadband matching module 300 coupled to each of these RF paths avoids the need for additional I/Q modulators and additional narrow-band matching networks in each of these RF paths. For example, the additional components 314 added for the RF path added to FIG. 3B include pre-driver 316 and power amplifier 318. The output of power amplifier 318 is input to antenna 322. Coupler 320 obtains a signal representative of the signal sent to antenna 322 and feeds this signal to multiplexer 314. It should be understood that any number of additional RF paths can be coupled to broadband matching module 300 in accordance with embodiments of the present disclosure.

Figure 3C:
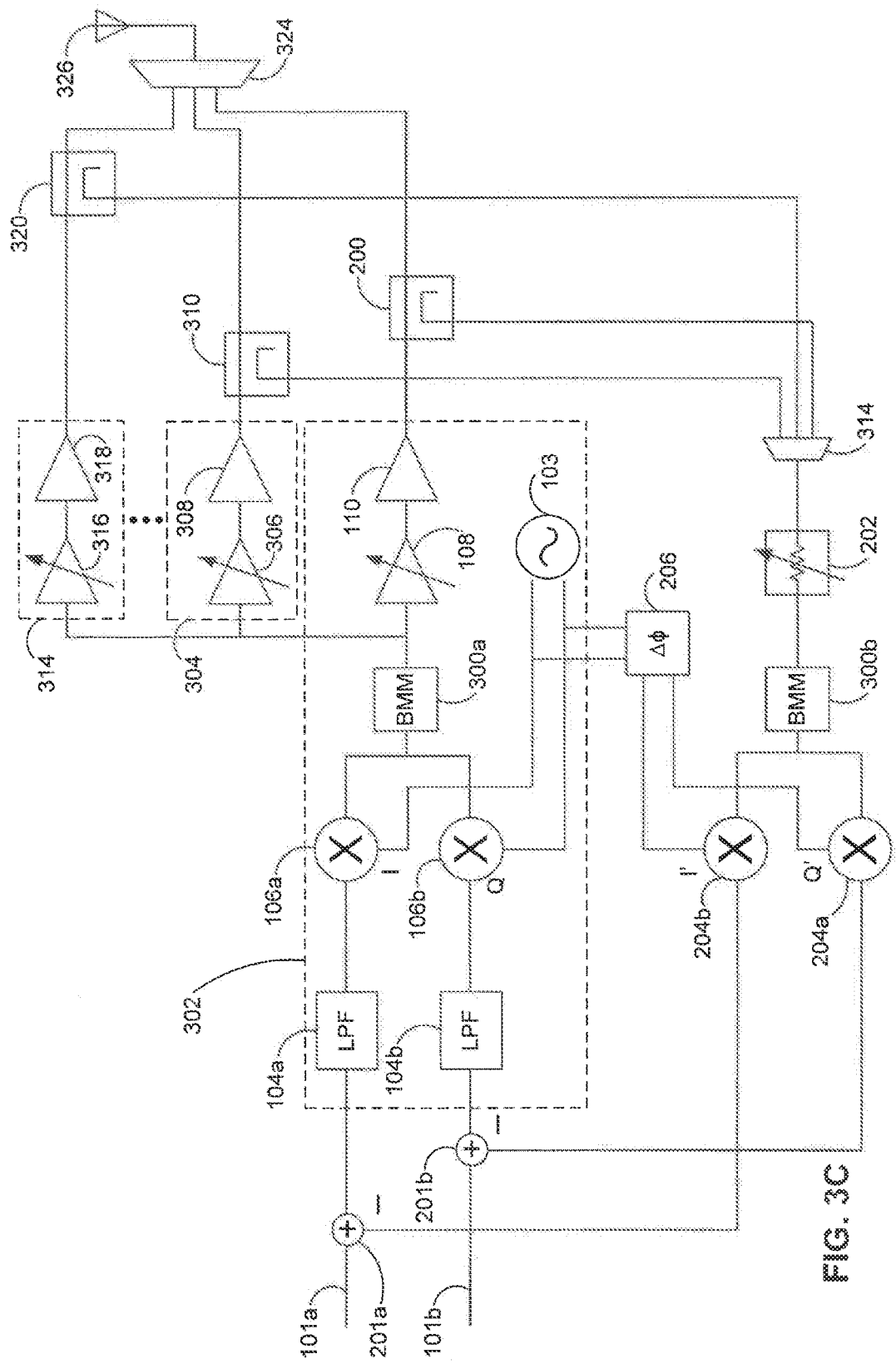
FIG. 3C shows a block diagram of an embodiment of the present disclosure for a multi-band transmitter with a Cartesian feedback loop that has a single antenna supporting multiple bands.

FIG. 3C shows a block diagram of an embodiment of the present disclosure for a multi-band transmitter with a Cartesian feedback loop that has a single antenna receiving data for transmission. In FIG. 3C, broadband matching module 300 supports circuitry for multiple frequency bands. For example, in FIG. 3C, pre-driver 108 and power amplifier 110 provide a first RF path to support a first frequency band, pre-driver 306 and power amplifier 308 provide a second RF path to support a second frequency band, and pre-driver 316 and power amplifier 318 provide a third RF path to support a third frequency band. If only one of these frequency bands is used for a transmission at any given time, multiple antennas are not required. Thus, in FIG. 3C, the outputs of power amplifiers 318, 308, and 110 are multiplexed by multiplexer 324 and are transmitted to a single antenna 326. The use of a single antenna as shown by FIG. 3C further reduces the circuitry required for the multi-band transmitter.

Figure 3D:
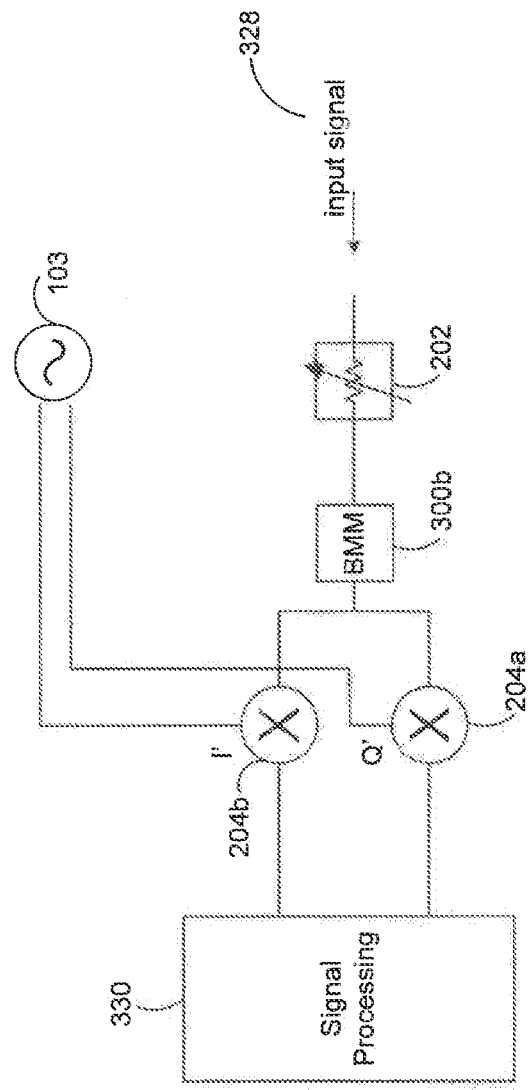
FIG. 3D is a block diagram of a receiver including a broadband matching module.

FIG. 3D shows a block diagram of a receiver including a broadband matching module in accordance with embodiments of the present invention. In FIG. 3D, an input signal 328 is passed to a sensing receiver 202. Impedance matching is performed by broadband matching module 300b, and the signal is demodulated by demodulator 204. The demodulated signal is then forwarded for further processing 330. Because broadband matching module 300b can perform impedance matching for a wide range (e.g., 2-4 GHz) of signals received by sensing receiver 202, broadband matching module 300b avoids the need to include multiple narrow-band matching networks for receiving signals within different frequency ranges. Further, because impedance matching can be done over a wide range of frequencies when broadband matching module 300b is incorporated into the circuit, demodulation can be performed using a single demodulator 204 for all supported frequency ranges.

2.4 Broadband Matching Module

Figure 4A:
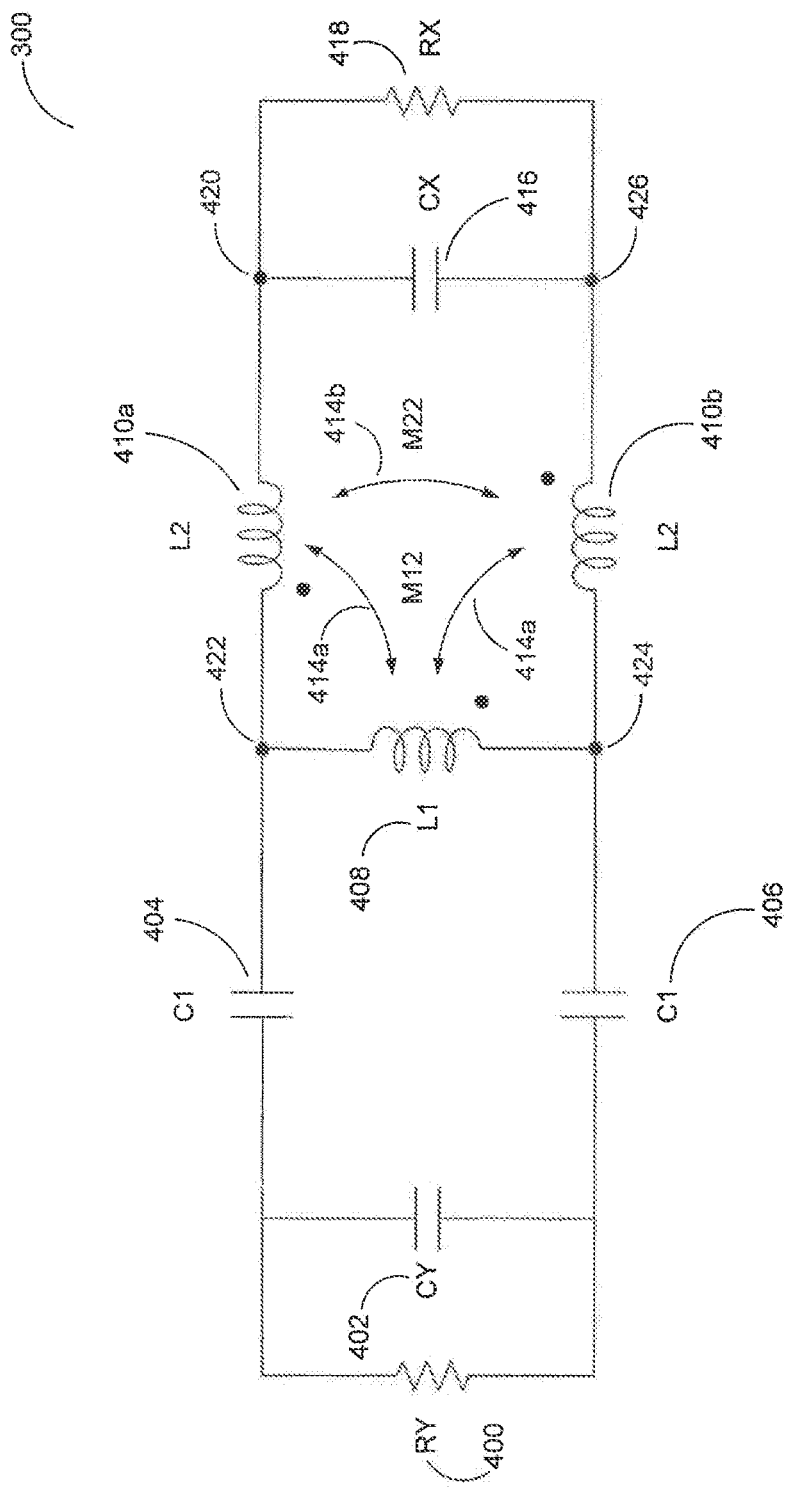
FIG. 4A is a circuit diagram of a broadband matching module that can be used in accordance with embodiments of the present disclosure.

FIG. 4A is a circuit diagram of a broadband matching module 300 that can be used in accordance with embodiments of the present disclosure. For example, broadband matching module 300 can correspond to broadband matching modules 300a and 300b in FIGS. 3A, 3B, 3C, and 3D. Broadband matching module 300 performs an impedance match between portions of a circuit with differing impedances. The circuit portion having a lower impedance is coupled to the left side of the broadband matching module 300 shown in FIG. 4A (i.e., it is coupled to capacitors 404 and 406). Capacitor CY 402 and resistor RY 400 represent the capacitance and resistance, respectively, that is experienced by broadband matching module when the lower impedance circuit portion is coupled to broadband matching module 300. Likewise, the circuit portion having a higher impedance is coupled to the right side of the broadband matching module 300 shown in FIG. 4A (i.e., it is coupled to inductor L2 410). Capacitor CX 416 and resistor RX 416 represent the capacitance and resistance, respectively, that is experienced by broadband matching module when the higher impedance circuit portion is coupled to broadband matching module 300.

For example, broadband matching module 300a in FIG. 3A performs impedance matching between I/Q modulator 106 and pre-drivers 108 and 306. Because I/Q modulator 106 has a higher impedance than pre-drivers 106 and 306, I/Q modulator 106 is coupled to inductor L2 410. In FIG. 4A, resistor RX 418 and capacitor CX 416 represent the resistance and capacitance, respectively, that is experienced by broadband matching module 300a when it is coupled to I/Q modulator 106. Likewise, because predrivers 108 and 306 have a lower impedance than I/Q modulator 106, pre-drivers 108 and 306 are coupled to capacitors 404 and 406 shown in FIG. 4A. Resistor RY 400 and capacitor CY 402 represent the resistance and capacitance, respectively, that is experienced by broadband matching module 300a when it is coupled to pre-drivers 108 and 306.

Broadband matching module 300b in FIG. 3A performs impedance matching between I/Q demodulator 204 and sensing receiver 202. Because I/Q demodulator 204 has a higher impedance than sensing receiver 202, I/Q demodulator 204 is coupled to inductor L2 shown in FIG. 4A. Resistor RX 418 and capacitor CX 420 represent the resistance and capacitance, respectively, that is experienced by broadband matching module 300b when it is coupled to I/Q demodulator 204. Likewise, because sensing receiver 202 has a lower impedance than I/Q demodulator 204, sensing receiver 202 is coupled to inductor capacitors 303 and 406 shown in FIG. 4A. Resistor RY 400 and capacitor CY 400 represent the resistance and capacitance, respectively, that is experienced by broadband matching module 300b when it is coupled to sensing receiver 202.

Broadband matching module 300 includes mutually coupled inductors that enable broadband impedance matching to support coupled RF paths. Inductor 408 and capacitors 404 and 406 are sufficient for a narrow band match. However, for broadband impedance matching, inductor L2 410 is added (shown as elements 410a and 410b in FIG. 4A) and is mutually coupled 414 to inductor L1 408. Because of at least (1) the mutual coupling 414 of inductor L2 410 to inductor L1 408, and (2) the inductance ratio between broadband matching module 300 can support broadband impedance matching for coupled RF paths. In one embodiment, the inductance ratio between inductor L1 408 and inductor L2 410 is approximately 3:2 inductance ratio. However, other ratios could be used, as will be understood by those skilled in art.

Figure 4B:
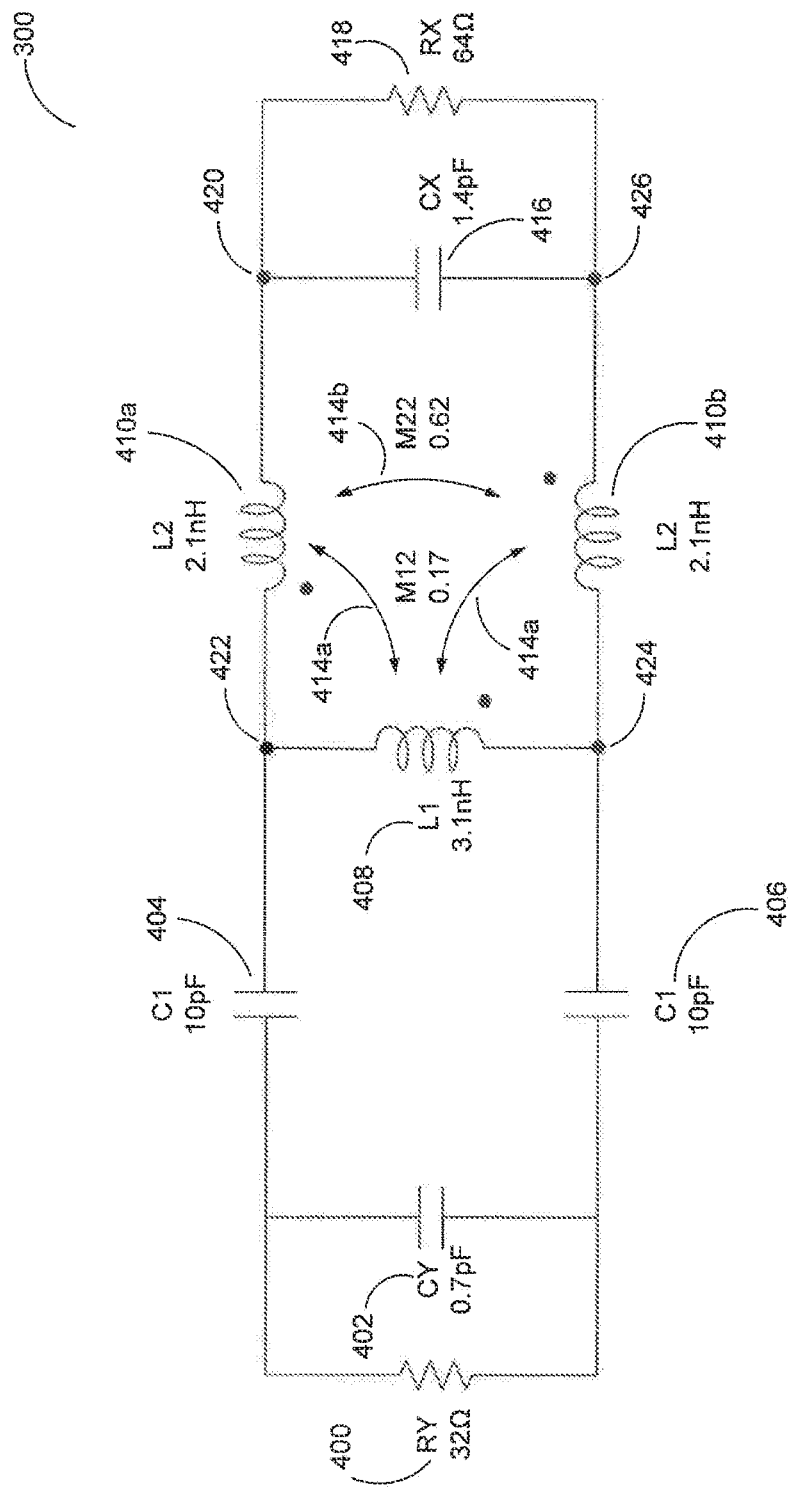
FIG. 4B shows a circuit diagram of a matching module that includes exemplary values for the elements shown in FIG. 4A.

FIG. 4B shows a circuit diagram of a broadband matching module that includes exemplary values for the elements shown in FIG. 4A. A broadband matching module with the values shown in FIG. 4B is operable to match frequencies in 2 GHz to 4 GHz bands. Other values can be selected, as will be understood by those skilled in the art. By selecting different component values for the circuit elements shown in FIG. 4B, the broadband matching module 300 of FIG. 4B can be configured to operate in another wide frequency band. For example, if a plurality of circuit elements that operate in a plurality of different frequency bands (e.g., pre-drivers 108 and 306) is coupled to broadband matching module 300, values for the elements of broadband matching module 300b (e.g., values for capacitors 404 and 406 and inductors 408 and 410) can be selected so that broadband matching module 300 is configured to operate in a wide frequency band that encompasses the plurality of different frequency bands of the elements it is coupled to.

Nodes 420, 422, 424, and 426 shown in FIGS. 4A and 4B represent ports at which circuitry of broadband matching module 300 couples to the inductor network formed by inductor L1 408 and inductor L2 410. These topology of this inductor network will now be explained in greater detail with reference to FIG. 5. The mutual coupling 414 of inductor L2 410 to inductor L1 408 is also shown in greater detail with reference to FIG. 5.

2.5 Mutual Coupling in Broadband Matching Module

Figure 5:
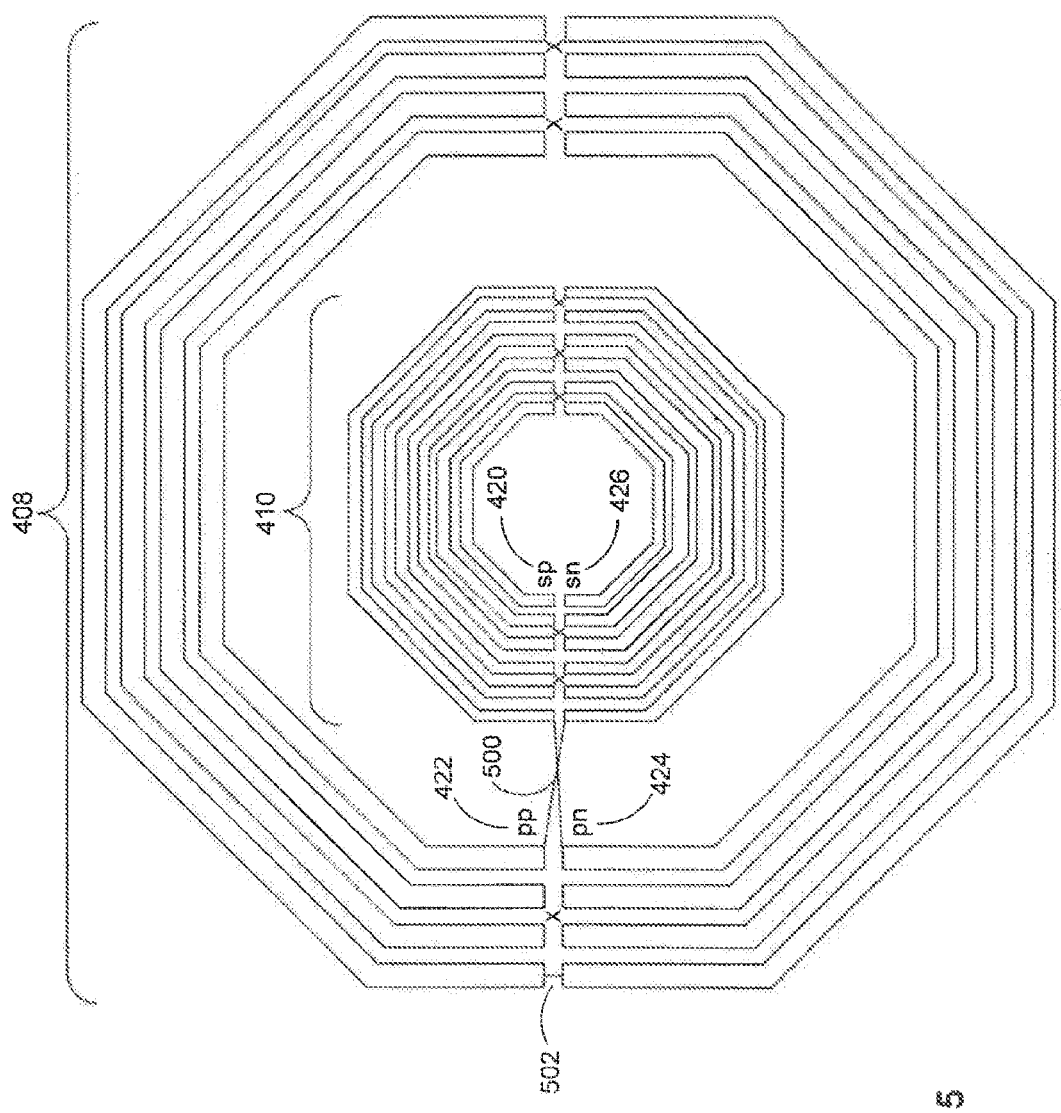
FIG. 5 is a diagram illustrating the mutual coupling of inductors in matching module in accordance with embodiments of the present disclosure.

FIG. 5 is a diagram illustrating the mutual coupling 414 of inductors L1 408 and L2 410 in broadband matching module 300 in accordance with embodiments of the present disclosure. FIG. 5 shows concentric, mutually-coupled, monolithic inductors in broadband matching module 300 positioned as an inter-stage match. In other words, FIG. 5 shows inductor L2 410 as being positioned inside inductor L1 408. Element 500 in FIG. 5 denotes the physical connection (e.g., via electrical wiring) between inductors L1 408 and L2 410, which is shown in FIG. 4A as nodes 422 and 424. Inductor L1 408 couples to inductor L2 410 at primary positive port 422 and primary negative port 424. Capacitors 404 and 406 (shown in FIG. 4A) also couple to primary positive port 422 and primary negative port 424. High impedance circuit portions that are to be matched are coupled to inductor L2 410 at secondary positive port 420 and secondary negative port 426. Element 502 in FIG. 5 represents the central portion of inductor L1 408. Thus, when current travels from node 422 to node 424 (shown in FIG. 4A), current travels from primary positive port 422, through central portion 502 of inductor L1 408, and proceeds to primary negative port 424.

In an embodiment, inductors L1 408 and L2 410 comprise a plurality of metal traces disposed on a semiconductor substrate. The "coupling" of L2 410 to itself 414b is caused by the turning inside inductor L2 410. In other words, the proximity between any two or more concentric metal traces of inductor L2 410 causes a coupling between the traces, resulting in L2 412 being "coupled" to itself and represented by coupling 414b. Further, L1 408 is "mutually coupled" 414 to L2 410 because L2 410 is located in an interior, open region of L1 408. The positioning of inductor L2 410 inside inductor L1 408 causes additional transfer of energy between L2 408 and L1 410, causing these inductors to be mutually coupled.

For example, when inductors are positioned next to each other, a change in current in one inductor induces a voltage in the other inductor, causing the inductors to become mutually coupled. The configuration of inductors L1 408 and L2 410 shown in FIG. 5b, in which inductor L2 410 is positioned within the interior region defined by the traces of inductor L1 408, enables a greater amount of coupling than the conventional coupling caused when inductors are positioned next to each other because each outer portion of the traces of inductor L2 410 is positioned "next to" a portion of the metal traces of inductor L1 408. This concentric arrangement of inductors L1 408 and L2 410 enables improves energy transfer between inductors L1 408 and L2 410 and reduces the amount of energy reflected when the energy is transferred. Because reflected energy is reduced, inductors L1 408 and L2 410 can be used to create an impedance matching network that operates for a broad range of frequencies (e.g., in an embodiment, 2 GHz to 4 GHz).

In one embodiment, the spacing between the metal traces of L2 410 is smaller than the spacing between L2 410 and L1 408. This smaller spacing causes a higher coupling coefficient M22 414b when compared to the coupling coefficient M12 414a caused by the mutual coupling between L1 408 and L2 410. This coupling configuration improves the ability of broadband matching module 300 to perform broadband impedance matching so that a larger range of RF paths can be supported.

2.6 Implementation

Embodiments of the present disclosure are applicable to various types of RF transmitter feedback systems, including systems with both feedback and non-feedback transmitters. For example, embodiments of the present disclosure can apply to polar feedback systems and Cartesian feedback systems. Further, embodiments of the present disclosure are applicable in 3G, 4G, and WiMAX systems.

Embodiments of the present disclosure shown in FIGS. 1A-5 can be located on a single integrated circuit (IC) or on a plurality of integrated circuits. For example, in an embodiment, circuitry for each supported frequency band can be located on a different integrated circuit. In an embodiment, all circuitry (e.g., all circuitry shown in FIG. 3C) is located on a single integrated circuit.

3. Methods

Figure 6:
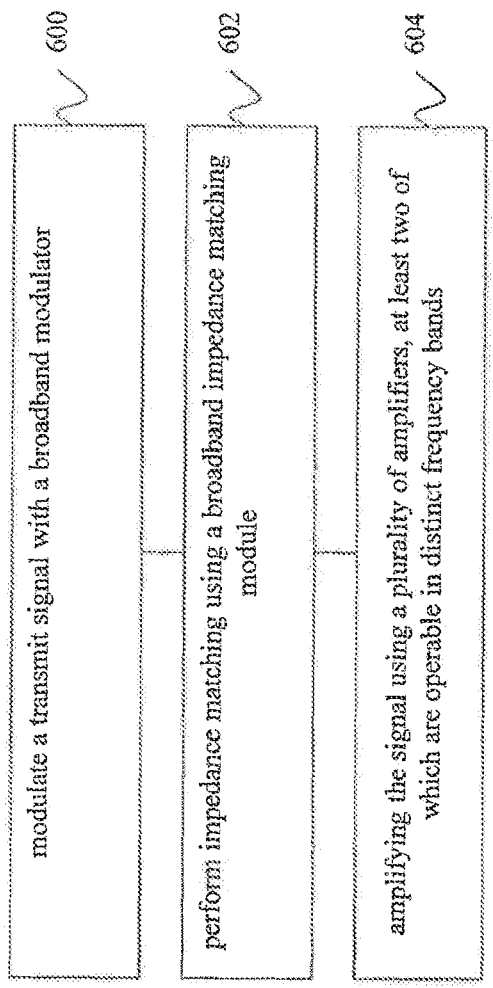
FIG. 6 is a flowchart of a method for transmission of a signal to multiple RF paths within different frequency bands using a broadband matching module in accordance with embodiments of the present invention.

FIG. 6 is a flowchart of a method for transmission of a signal to multiple RF paths having different frequency bands using a broadband matching module in accordance with embodiments of the present disclosure. In step 600, a transmit signal is modulated with a broadband modulator (e.g., using I/Q modulator 106). In step 602, impedance matching is performed using a broadband impedance matching module. For example, broadband matching module 300a performs broadband impedance matching for a wide band of frequency ranges to support a plurality of RF paths having different frequency ranges. In step 604, the signal is amplified using a plurality of amplifiers (e.g., amplifiers 318, 308, and 110). Because broadband matching module 300a performs broadband impedance matching for a wide band of frequency ranges, a single matching network can be used to support multiple RF paths.

Figure 7:
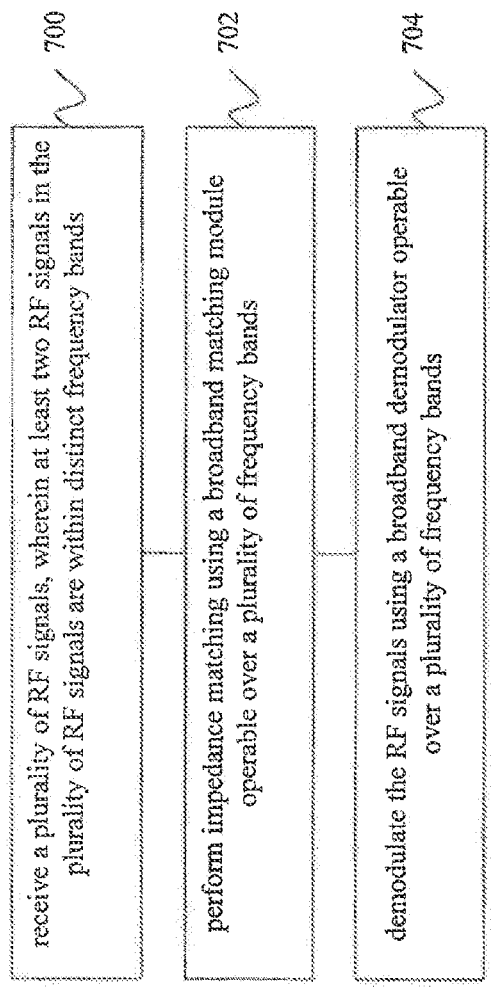
FIG. 7 is a flowchart of a method for receiving a plurality of signals within different frequency bands and forwarding them for processing using a broadband matching module in accordance with embodiments of the present invention.

FIG. 7 is a flowchart of a method for receiving a plurality of signals within different frequency bands and forwarding them for processing using a broadband matching module in accordance with embodiments of the present disclosure. In step 700, a plurality of RF signals within distinct frequency bands are received (e.g., by sensing receiver 202. In step 702, impedance matching is performed using a broadband matching module operable over a plurality of frequency bands. For example, broadband matching module 300b performs wideband impedance matching for all of the received signals. In step 704, the RF signals are demodulated using a broadband demodulator operable over a plurality of frequency bands (e.g., using I/Q demodulator 204). Using a broadband matching module to perform impedance matching for a plurality of signals within different frequency bands avoids the need for multiple narrow-band matching networks.

4. Conclusion

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g. software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present invention.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A matching module configured to perform impedance matching over a frequency range, the matching module comprising:
   a first inductor comprising a first plurality of concentric metal traces; and
   a second inductor comprising a second plurality of concentric metal traces positioned within an interior region defined by the first plurality of concentric metal traces, wherein the second inductor is mutually coupled with the first inductor.

2. The matching module of claim 1, wherein an inductance ratio between the first inductor and the second inductor is approximately 3:2.

3. The matching module of claim 1, wherein the frequency range comprises frequencies between 2 GHz and 4 GHz.

4. The matching module of claim 1, wherein the second inductor is configured to couple to:
   a primary positive port of the first inductor; and
   a primary negative port of the first inductor.

5. The matching module of claim 1, wherein a second spacing of the second plurality of concentric metal traces is smaller than a first spacing of the first plurality of concentric metal traces.

6. The matching module of claim 1, further comprising:
   a modulator coupled to the first inductor.

7. The matching module of claim 1, further comprising:
   an amplifier pre-driver coupled to the second inductor.

8. The matching module of claim 1, further comprising:
   a first circuit coupled to the first inductor; and
   a second circuit coupled to the second inductor, wherein the second circuit has a higher impedance than the first circuit.

9. The matching module of claim 8, wherein the first circuit is a modulator.

10. The matching module of claim 8, wherein the second circuit is an amplifier pre-driver.

11. The matching module of claim 1, further comprising:
    a first amplifier coupled to a first output of the matching module, wherein the first amplifier is configured to amplify signals within a first frequency range, and wherein the first frequency range is within the frequency range; and
    a second amplifier coupled to a second output of the matching module, wherein the second amplifier is configured to amplify signals within a second frequency range, and wherein the second frequency range is within the frequency range.

12. A multi-band transmitter, comprising:
    a modulator; and
    a matching module coupled to an output of the modulator, wherein the matching module is configured to perform impedance matching over a frequency range, and wherein the matching module comprises:
       a first inductor comprising a first plurality of concentric metal traces, and
       a second inductor comprising a second plurality of concentric metal traces positioned within an interior region defined by the first plurality of concentric metal traces, wherein the second inductor is mutually coupled with the first inductor.

13. The multi-band transmitter of claim 12, further comprising:
    a first amplifier coupled to a first output of the matching module, wherein the first amplifier is configured to amplify signals within a first frequency range, and wherein the first frequency range is within the frequency range; and
    a second amplifier coupled to a second output of the matching module, wherein the second amplifier is configured to amplify signals within a second frequency range, and wherein the second frequency range is within the frequency range.

14. The multi-band transmitter of claim 13, wherein the first amplifier is coupled to a first antenna configured to transmit signals within the first frequency range, and wherein the second amplifier is coupled to a second antenna configured to transmit signals within the second frequency range.

15. The multi-band transmitter of claim 13, wherein the first amplifier and the second amplifier are coupled to a shared antenna configured to transmit signals within the frequency range.

16. The multi-band transmitter of claim 13, further comprising:
   a first coupler coupled to an output of the first amplifier;
   a second coupler coupled to an output of the second amplifier; and
   a sensing receiver configured to receive signals from the first coupler and the second coupler.

17. The multi-band transmitter of claim 16, further comprising:
   a second matching module coupled to an output of the sensing receiver, wherein the second matching module is configured to perform impedance matching over the frequency range.

18. The multi-band transmitter of claim 17, further comprising:
   a demodulator coupled to the modulator and to an output of the second matching module;
   a local oscillator; and
   a phase adjustment module coupled to the demodulator and to the local oscillator, wherein the phase adjustment module is configured to match a first phase of the demodulator to a second phase of the modulator.

19. A method for performing impedance matching, the method comprising:
   receiving a plurality of radio frequency (RF) signals, wherein at least two RF signals in the plurality of RF signals are within distinct frequency bands;
   performing impedance matching for the RF signals using a matching module having a plurality of concentric, mutually-coupled inductors, wherein the matching module is operable over a plurality of frequency bands including the distinct frequency bands; and
   distributing the RF signals to a first amplifier operable in a first frequency band and a second amplifier operable in a second frequency band.

20. The method of claim 19, further comprising:
   modulating the plurality of RF signals using a modulator operable over the plurality of frequency bands.

* * * * *